United States Patent
Liu et al.

(10) Patent No.: US 6,673,661 B1
(45) Date of Patent: Jan. 6, 2004

(54) SELF-ALIGNED METHOD FOR FORMING DUAL GATE THIN FILM TRANSISTOR (TFT) DEVICE

(75) Inventors: Chi-Wen Liu, Hsin chu (TW); Ting-Chang Chang, Hsin chu (TW); Po-Tsun Liu, Hsin chu (TW); Ying-Lang Wang, Tai Chung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/324,965

(22) Filed: Dec. 20, 2002

(51) Int. Cl.[7] .................................. H01L 21/84
(52) U.S. Cl. .................. 438/157; 438/161; 438/283
(58) Field of Search .................. 438/151, 157, 438/158, 161, 279, 283

(56) References Cited

U.S. PATENT DOCUMENTS

| | | | |
|---|---|---|---|
| 5,273,921 A | * 12/1993 | Neudeck et al. | 438/157 |
| 5,356,824 A | * 10/1994 | Chouan et al. | 438/157 |
| 5,658,806 A | 8/1997 | Lin et al. | 438/157 |
| 5,937,283 A | 8/1999 | Lee | 438/157 |
| 6,252,248 B1 | * 6/2001 | Sano et al. | 257/59 |
| 6,391,693 B1 | * 5/2002 | Cho et al. | 438/160 |

* cited by examiner

*Primary Examiner*—Chandra Chaudhari
(74) *Attorney, Agent, or Firm*—Tung & Associates

(57) ABSTRACT

A method for fabricating a dual gate thin film transistor (TFT) device provides for forming a pair of source/drain layers self-aligned with respect to a first gate electrode and forming a second gate electrode self-aligned with respect to both the pair of source/drain layers and the first gate electrode. Thus, the dual gate TFT device is fabricated with enhanced alignment. In addition, the dual gate TFT device (or a single gate TFT device) may be fabricated with source/drain layers formed of a silicon-germanium alloy material, such as to provide the TFT device with enhanced performance with respect to a kink effect.

13 Claims, 3 Drawing Sheets

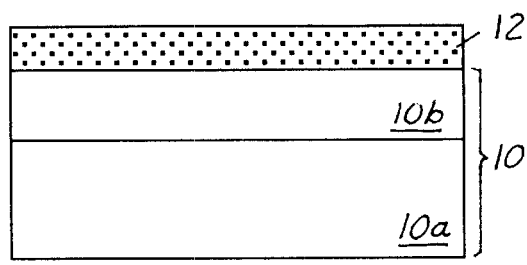
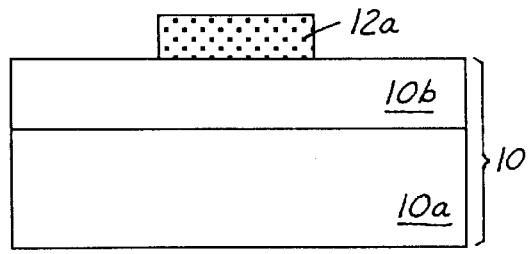
FIG. 1　　　　　FIG. 2
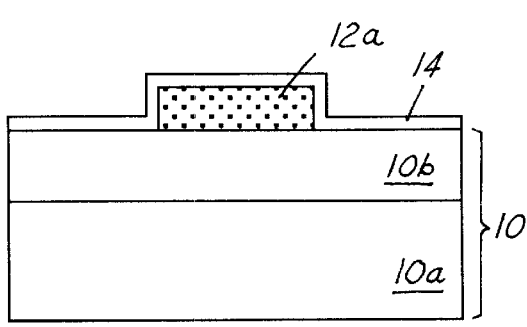
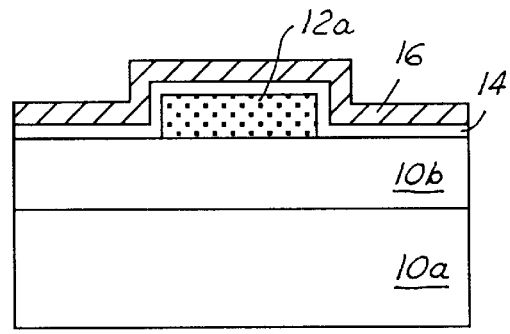
FIG. 3　　　　　FIG. 4
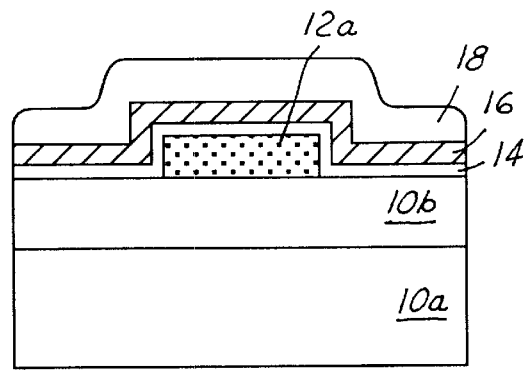
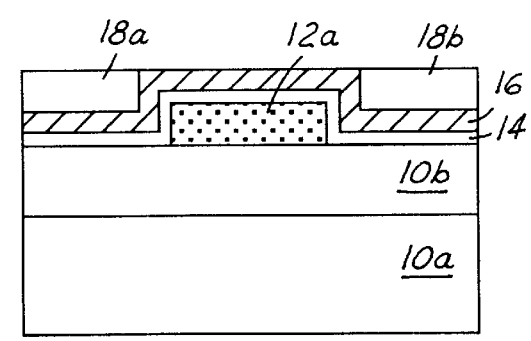
FIG. 5　　　　　FIG. 6

SELF-ALIGNED METHOD FOR FORMING DUAL GATE THIN FILM TRANSISTOR (TFT) DEVICE

BACKGROUND OF THE INVENTION

1. Field of the Invention

The present invention relates generally to methods for fabricating thin film transistor (TFT) devices. More particularly, the present invention relates to methods for fabricating TFT devices with enhanced performance and enhanced alignment.

2. Description of the Related Art

Thin film transistor (TFT) devices are semiconductor devices typically formed employing a semiconductor channel layer and a pair of source/drain layers laminated over an insulator substrate rather than formed within a semiconductor substrate. TFT devices are extensively employed as switching devices and peripheral circuit devices within active matrix liquid crystal display (AMLCD) optoelectronic products. TFT devices are also employed as load transistors within synchronous dynamic random access memory (SDRAM) products.

While TFT devices are thus common in the microelectronic product fabrication art, thin film transistor devices are nonetheless not entirely without problems. In that regard, insofar as TFT devices are formed employing a semiconductor channel layer and a pair of source/drain layers laminated over an insulator substrate, rather than formed within a semiconductor substrate, TFT devices are thus often difficult to form with both enhanced performance and enhanced alignment.

It is thus desirable within the microelectronic product fabrication art to provide TFT devices, and methods for fabrication thereof, with enhanced performance and enhanced alignment.

It is towards the foregoing object that the present invention is directed.

Various TFT devices having desirable properties, and methods for fabrication thereof, have been disclosed within the microelectronic product fabrication art. Included but not limiting among such devices and methods are those disclosed within: (1) Lin et al., in U.S. Pat. No. 5,658,806 (a self-aligned planarizing method for forming a planar TFT device); and (2) Lee, in U.S. Pat. No. 5,937,283 (an additional self-aligned planarizing method for forming a trench TFT device).

Desirable within the microelectronic product fabrication art are additional TFT devices with enhanced performance and enhanced alignment, and methods for fabrication thereof.

It is towards the foregoing object that the present invention is directed.

SUMMARY OF THE INVENTION

A first object of the invention is to provide a TFT device and a method for fabricating the TFT device.

A second object of the invention is to provide a TFT device and a method for fabricating the TFT device in accord with the first object of the invention, wherein the TFT device is fabricated with enhanced performance and enhanced alignment.

In accord with the objects of the invention, the invention provides a TFT device and a method for fabricating the TFT device.

In accord with the invention, the TFT device comprises a substrate. The TFT device also comprises at least one gate electrode formed over the substrate and separating a pair of source/drain layers also formed over the substrate. In addition, the at least one gate electrode is separated by a gate dielectric layer from a semiconductor channel layer also formed over the substrate and contacting the pair of source/drain layers. Within the TFT device, the pair of source/drain layers is formed of a silicon-germanium alloy material.

In accord with the invention, the method for fabricating the TFT device first provides a planar substrate. The method further provides for forming over the planar substrate a topographic first gate electrode and forming upon the topographic first gate electrode a first gate dielectric layer. In turn, the method provides for forming separated by the first gate electrode a pair of source/drain layers and forming contacting the pair of source/drain layers and the first gate dielectric layer a semiconductor channel layer. The method still further provides for forming contacting the semiconductor channel layer a second gate dielectric layer and forming contacting the second gate dielectric layer and also separating the pair source/drain layers a second gate electrode. Within the method: (1) the pair of source/drain layers is formed in a self aligned fashion with respect to the first gate electrode; and (2) the second gate electrode is formed in a self aligned fashion with respect to the pair of source/drain layers and the first gate electrode.

The invention provides a TFT device and a method for fabricating the TFT device, wherein the TFT device is fabricated with enhanced performance and enhanced alignment.

With respect to enhanced performance, the TFT device realizes that object by forming the TFT device with a pair of source/drain layers formed of a silicon-germanium alloy material.

With respect to enhanced alignment, the present invention realizes that object by forming the TFT device as a dual gate TFT device with: (1) a pair of source/drain layers formed in a self aligned fashion with respect to a first gate electrode; and (2) a second gate electrode formed in a self aligned fashion with respect to the pair of source/drain layers and the first gate electrode.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein:

FIG. 1, FIG. 2, FIG. 3, FIG. 4, FIG. 5, FIG. 6, FIG. 7, FIG. 8, FIG. 9 and FIG. 10 show a series of schematic cross-sectional diagrams illustrating the results of progressive stages in forming a TFT device in accord with the present invention.

DESCRIPTION OF THE PREFERRED EMBODIMENT

Figure 7:
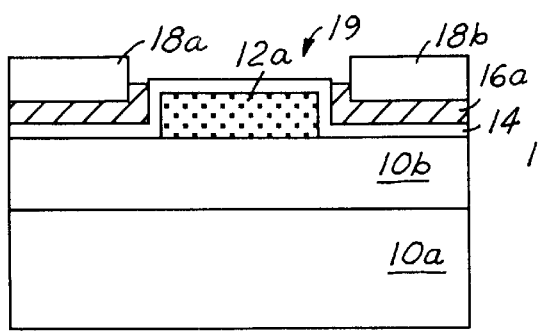

The invention provides a TFT device and a method for fabricating the TFT device, wherein the TFT device is fabricated with enhanced performance and enhanced alignment.

With respect to enhanced performance, the TFT device realizes that object by forming the TFT device with a pair of source/drain layers formed of a silicon-germanium alloy material.

With respect to enhanced alignment, the present invention realizes that object by forming the TFT device with: (1) a pair of source/drain layers formed in a self-aligned fashion with respect to a first gate electrode; and (2) a second gate electrode formed in a self-aligned fashion with respect to the pair of source/drain layers and the first gate electrode.

While the preferred embodiment of the invention illustrates the invention within the context of a single TFT device simultaneously realizing both of the foregoing objects of the invention, the invention is not in a first instance intended to be so limited. Rather, the invention may be understood within the context of: (1) a first TFT device (either a single gate TFT device or a dual gate TFT device) having a pair of source/drain layers formed of a silicon-germanium alloy material (rather than a silicon material); and (2) a separate second TFT device (necessarily a dual gate TFT device) having: (a) a pair of source/drain layers being formed in a self-aligned fashion with respect to a first gate electrode; and (2) a second gate electrode being formed in a self-aligned fashion with respect to the pair of source/drain layers and the first gate electrode.

FIG. 1 to FIG. 10 provide a series of schematic cross-sectional diagrams illustrating the results of progressive stages in fabricating a TFT device in accord with the present invention.

FIG. 1 illustrates a substrate 10 having formed thereupon a blanket first gate electrode material layer 12.

Within the invention, the substrate 10 is a planar substrate, and it may comprise a silicon substrate 10a having formed thereupon a thermal silicon oxide layer 10b formed to a thickness of from about 4000 to about 6000 angstroms. Alternatively, the substrate 10 may comprise any of several other types of planar substrates having their top surfaces formed of dielectric materials. Thus, the substrate 10 is also intended as an insulator substrate. Suitable alternative substrates for the substrate 10 may also include, but are not limited to glass, substrates, quartz substrates and ceramic substrates.

Within the invention, the blanket first gate electrode material layer 12 is formed of an amorphous silicon material or a polysilicon material, typically doped with a dopant such as but not limited to a phosphorus dopant, to provide a concentration of from about 1E20 to about 1E22 dopant atoms per cubic centimeter. The blanket first gate electrode material layer 12 may typically be formed employing a low pressure chemical vapor deposition (LPCVD) method, to provide the blanket first gate electrode material layer of thickness from about 2000 to about 3000 angstroms.

FIG. 2 illustrates the results of patterning the blanket first gate electrode material layer 12 to form a first gate electrode 12a.

The first gate electrode 12a may be formed of a linewidth of from about 0.1 to about 20 microns while employing photolithographic and etch methods as are conventional in the microelectronic product fabrication art.

FIG. 3 illustrates the results of conformally forming (i.e., forming to a single thickness) a blanket first gate dielectric layer 14 upon exposed portions of the substrate 10 and the first gate electrode 12a.

The blanket first gate dielectric layer 14 is typically formed of a silicon oxide material formed to a thickness of from about 900 to about 1100 angstroms. The silicon oxide material may be formed while employing a low temperature chemical vapor deposition method, typically at a temperature of from about 400 to about 450 degrees centigrade.

FIG. 4 illustrates the results of conformally forming a blanket planarizing stop layer 16 upon the first gate dielectric layer 14.

The blanket planarizing stop layer 16 is typically formed of a silicon nitride material, such as to provide appropriate etch selectivity as will be disclosed in further detail below. The silicon nitride material is typically formed to a thickness of from about 1500 to about 2500 angstroms while employing a plasma enhanced chemical vapor deposition (PECVD) method.

FIG. 5 illustrates the results of forming a blanket source/drain material layer 18 upon the blanket planarizing stop layer 16.

The blanket source/drain material layer 18 is formed of a polycrystalline silicon-germanium alloy material (and not a silicon material) deposited employing an ultra high vacuum chemical vapor deposition (UHV-CVD) method and formed to a thickness of from about 2500 to about 3500 angstroms. The silicon-germanium alloy material typically has a germanium atomic content of from about 10 to about 30 atomic percent and a doping of an appropriate dopant at a concentration of from about 1E16 to about 1E18 dopant atoms per cubic centimeter.

FIG. 6 illustrates the results of planarizing the blanket source/drain material layer 18 to form a pair of source/drain layers 18a and 18b, while employing the blanket planarizing stop layer 16 as a planarizing stop layer.

The blanket source/drain material layer 18 may be planarized while employing chemical mechanical polish (CMP) planarizing methods as are otherwise generally conventional in the microelectronic product fabrication art, to provide the pair of source/drain layers 18a and 18b formed in a self-aligned fashion with respect to the first gate electrode 12a.

FIG. 7 illustrates the results of stripping an exposed portion of the blanket planarizing stop layer 16 from over the first gate electrode 12a to leave exposed a portion of the blanket first gate dielectric layer 14 and thus form a pair of patterned planarizing stop layers 16a and 16b. As is illustrated in FIG. 7, each of the pair of source/drain layers 18a and 18b is thus elevated with respect to the blanket first gate dielectric layer 14 and the first gate electrode 12a and the pair of source/drain layers 18a and 18b thus define a recess 19 thereover.

The portion of the blanket planarizing stop layer 16 may be stripped to form the pair of patterned planarizing stop layers 16a and 16b while employing an aqueous phosphoric acid solution, at an elevated temperature.

Figure 8:
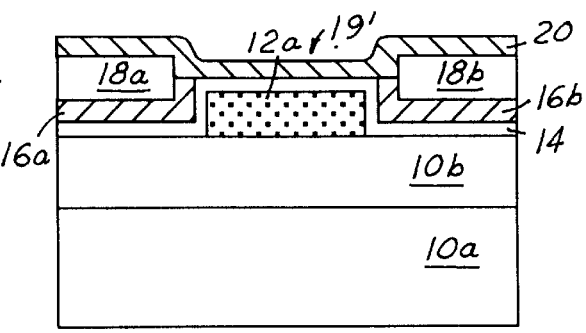

FIG. 8 illustrates the results of conformally forming a blanket semiconductor channel layer 20 contacting exposed portions of the pair of source/drain layers 18a and 18b, the pair of patterned planarizing stop layers 16a and 16b and the blanket first gate dielectric layer 14, thus forming from the recess 19 a replicated recess 19'.

The blanket semiconductor channel layer 20 is typically formed of an amorphous silicon material formed to a thickness of from about 250 to about 350 angstroms while employing an LPCVD method. The amorphous silicon material may be thermally annealed while employing a laser annealing method or a metal induced unilateral crystallization method to provide a polycrystalline silicon material from the amorphous silicon material. The blanket semiconductor channel layer 20 is not formed of a silicon-germanium alloy material. The blanket semiconductor channel layer 20 is typically doped with an appropriate dopant at a dopant concentration of from 1E8 to about 1E10 dopant atoms per cubic centimeter.

Figure 9:
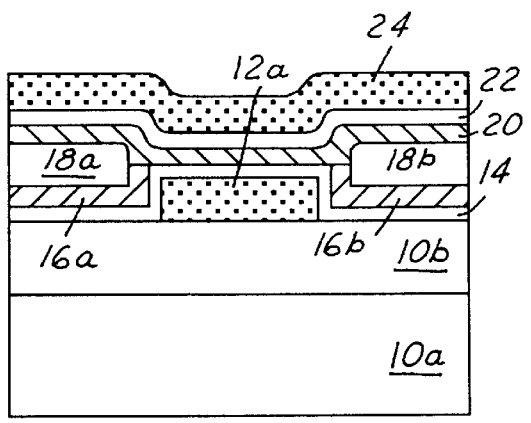

FIG. 9 illustrates the results of conformally forming a blanket second gate dielectric layer 22 upon the blanket semiconductor channel layer 20 and conformally forming a blanket second gate electrode material layer 24 upon the blanket second gate dielectric layer 22.

Within the invention, the blanket second gate dielectric layer 22 may be formed employing methods and materials analogous or equivalent to those employed for forming the blanket first gate dielectric layer 14. In addition, the blanket second gate electrode material layer 24 may be formed employing methods and materials analogous or equivalent to those employed for forming the blanket first gate electrode material layer 12. Typically, the blanket second gate dielectric layer is formed to a thickness of from about 900 to about 1100 angstroms and the blanket second gate electrode material layer is formed to a thickness of from about 4000 to about 7000 angstroms.

Figure 10:
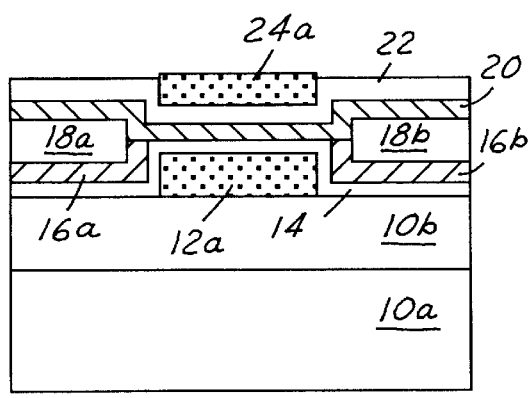

FIG. 10 illustrates the results of planarizing the blanket second gate electrode material layer 24 to form a second gate electrode 24a, while employing the blanket second gate dielectric layer 22 as a planarizing stop layer.

The blanket second gate electrode material layer 24 may be planarized while employing methods and materials as are otherwise conventional in the microelectronic product fabrication art, and will typically employ CMP planarizing methods. As is illustrated within FIG. 10, the second gate electrode 24a is formed in a self-aligned fashion with respect to the pair of source/drain layers 18a and 18b, which as disclosed above is in turn formed in a self-aligned fashion with respect to the first gate electrode 12a. Thus, the second gate electrode 24a is also formed in a self-aligned fashion with respect to the first gate electrode 12a. Thus, the invention provides for enhanced alignment of both a first gate electrode and a second gate electrode with each other and with a pair of source/drain layers when fabricating a TFT device.

Figure 11:
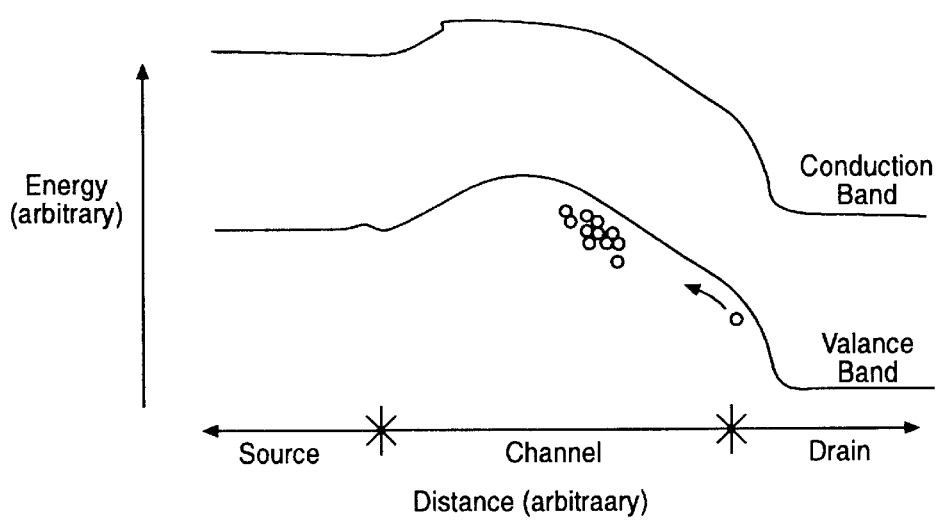
FIG. 11 and FIG. 12 show a pair of energy band diagrams illustrating charge carrier energy levels within a TFT device not in accord with the invention and in accord with the invention.
Figure 12:
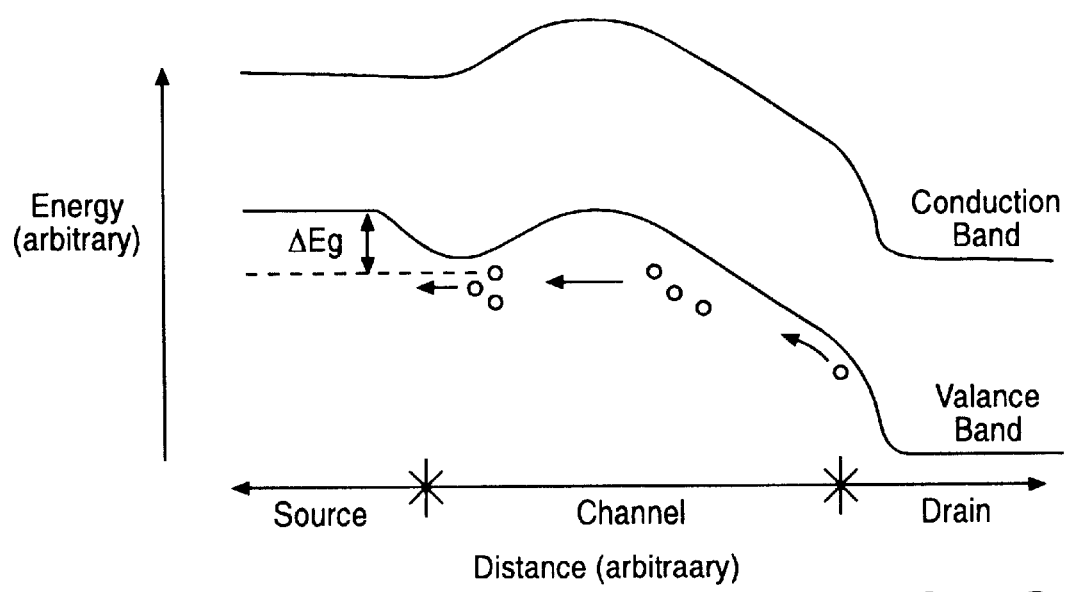

FIG. 11 and FIG. 12 show a pair of energy band diagrams for a pair of TFT devices, one formed in accord with the invention and the other formed not in accord with the invention. The pair of energy band diagrams is intended to illustrate the value of the present invention in providing enhanced performance of a TFT device incident to fabricating the TFT device with a pair of source/drain layers formed of a silicon-germanium alloy material, rather than a silicon material.

Within the context of the present invention, the use of a silicon-germanium alloy material for the source/drain layers within a TFT device provides for decreased source/drain contact resistance, as well as a reduction in an effect known as the kink effect. When a TFT device operates in saturation, a lateral electric field at a drain layer becomes large, which in turn causes acceleration of charge carriers (i.e., typically holes) at the bottom of a semiconductor channel layer with respect to a source layer. This results in a large current within the TFT device. It is known as the kink effect.

FIG. 11 illustrates an energy band diagram for a TFT device not in accord with the invention (i.e., with a silicon semiconductor channel layer and a pair of silicon (not silicon-germanium alloy) source/drain layers. FIG. 2 illustrates accumulation of charge carriers (illustrated as circles) at the bottom of the semiconductor channel layer. The invention provides for discharging the accumulation of charge carriers effectively with respect to the source layer. The invention realizes this object by employing a silicon-germanium alloy material for source/drain layers. The silicon-germanium alloy material source layers have a lower bandgap energy ($\Delta Eg$) in comparison with a silicon material source layer. Charge carrier dissipation from a semiconductor channel layer to a source layer is approximately directly related to $\exp(\Delta Eg/2kT)$. Thus, a lower bandgap energy ($\Delta Eg$) provides more efficient charge carrier dissipation.

FIG. 12 illustrates an energy band diagram of a TFT in accord with the invention (i.e., source/drain layers formed of a silicon-germanium alloy material and semiconductor channel layer formed of a silicon material (i.e., not a silicon-germanium alloy material). Due to use of the lower bandgap energy ($\Delta Eg$) silicon-germanium alloy material, the source layer provides a lower energy barrier when coupled with the semiconductor channel layer formed of a silicon material. Thus, charge carrier accumulation at the bottom of the semiconductor channel layer may be dissipated and reduced. In turn, the kink effect is thus also reduced. In addition, an output resistance and gain of the TFT device is increased, as is desirable to provide an enhanced drive current within the TFT device.

The preferred embodiment of the invention is illustrative of the invention rather than limiting of the invention. Revisions and modifications may be made to methods, materials, structures and dimensions in accord with the preferred embodiment of the invention while still providing an embodiment in accord with the invention, further in accord with the accompanying claims.

What is claimed is:

1. A method for fabricating a thin film transistor comprising:
   providing a planar substrate;
   forming over the planar substrate a topographic first gate electrode;
   forming upon the topographic first gate electrode a first gate dielectric layer;
   forming separated by the first gate electrode and the first gate dielectric layer a pair of source/drain layers;
   forming upon the pair of source/drain layers and the first gate dielectric layer a semiconductor channel layer which forms a recess with respect to the pair of source/drain layers;
   forming upon the semiconductor channel layer a second gate dielectric layer; and
   forming upon the second gate dielectric layer and also separating the pair of source/drain layers a second gate electrode, wherein:
   the pair of source/drain layers is formed in a self-aligned fashion with respect to the first gate electrode; and
   the second gate electrode is formed in a self-aligned fashion with respect to the pair of source/drain layers and the first gate electrode.

2. The method of claim 1 wherein the planar substrate is an insulator substrate.

3. The method of claim 1 wherein each of the first gate electrode and the second gate electrode is formed of a silicon material selected from the group consisting of amorphous silicon materials and polycrystalline silicon materials.

4. The method of claim 1 wherein each of the source/drain layers is formed of a silicon-germanium alloy material.

5. The method of claim 4 wherein the silicon-germanium alloy material has a germanium content of from about 10 to about 30 atomic percent.

6. The method of claim 1 wherein the semiconductor channel layer is formed of a silicon material and not a silicon-germanium alloy material.

7. The method of claim 6 wherein the semiconductor channel layer is formed to a thickness of from about 250 to about 350 angstroms.

8. A method for fabricating a thin film transistor comprising:

provadidng a planar substrate;

forming over the planar substrate a topographic first gate electrode;

forming conformally upon the topographic first gate electrode a first gate dielectric layer;

forming conformally upon the first gate dielectric layer a planarizing stop layer;

forming upon the planarizing stop layer a silicon-germanium alloy material layer;

planarizing the silicon-germanium alloy material layer to reach the planarizing stop layer and form a pair of source/drain layers separated by the topographic first gate electrode;

stripping from over the first gate dielectric layer a portion of the planarizing stop layer to expose a portion of the first gate dielectric layer;

forming conformally upon exposed portions of the pair of source/drain layers and the first gate dielectric layer a semiconductor channel layer which forms a recess with respect to the pair of source/drain layers;

forming conformally upon the semiconductor channel layer a second gate dielectric layer;

forming upon the second gate dielectric layer a second gate electrode material layer; and planarizing the second gate electrode material layer to form a second gate electrode within the recess defined by the pair of source/drain layers.

9. The method of claim 8 wherein the planar substrate is an insulator substrate.

10. The method of claim 8 wherein each of the first gate electrode and the second gate electrode is formed of a silicon material selected from the group consisting of amorphous silicon materials and polycrystalline silicon materials.

11. The method of claim 8 wherein the semiconductor channel layer is formed of a silicon material and not a silicon-germanium alloy material.

12. The method of claim 11 wherein the semiconductor channel layer is formed to a thickness of from about 250 to about 350 angstroms.

13. The method of claim 8 wherein the silicon-germanium alloy material has a germanium content of from about 10 to about 30 percent.

* * * * *